(12) United States Patent
Bollesen

(10) Patent No.: US 6,304,445 B1
(45) Date of Patent: Oct. 16, 2001

(54) FAN HEAT SINK AND METHOD

(75) Inventor: Vernon P. Bollesen, Milpitas, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/560,654

(22) Filed: Apr. 27, 2000

(51) Int. Cl.[7] ................................................. H05K 7/20
(52) U.S. Cl. ...................... 361/697; 361/690; 361/694; 361/695; 257/722; 174/16.1; 174/16.3; 165/80.3
(58) Field of Search ..................... 361/690, 694, 361/695, 704, 707, 715, 717–720, 722; 165/80.2, 80.3, 80.4, 185; 174/16.1, 16.3; 257/706, 707, 712–714, 721, 722

(56) References Cited

U.S. PATENT DOCUMENTS

| | | | |
|---|---|---|---|
| 4,972,294 | 11/1990 | Moses, Jr. et al. | 361/386 |
| 5,077,638 | 12/1991 | Andersson et al. | 361/388 |
| 5,208,731 | 5/1993 | Blomquist | 361/386 |
| 5,253,702 | 10/1993 | Davidson et al. | 165/80.4 |
| 5,276,585 | 1/1994 | Smithers | 361/704 |
| 5,307,239 | 4/1994 | McCarty et al. | 361/704 |
| 5,329,426 | 7/1994 | Villani | 361/719 |
| 5,329,993 | 7/1994 | Ettehadieh | 165/104.14 |
| 5,343,362 | 8/1994 | Solberg | 361/710 |
| 5,353,863 | * 10/1994 | Yu | 165/80.3 |
| 5,367,193 | 11/1994 | Malladi | 257/707 |
| 5,373,099 | 12/1994 | Boitard et al. | 174/16.3 |
| 5,423,375 | 6/1995 | Chiou | 165/80.3 |
| 5,570,271 | 10/1996 | Lavochkin | 361/704 |
| 5,586,005 | 12/1996 | Cipolla et al. | 361/719 |
| 5,621,244 | 4/1997 | Lin | 257/713 |
| 5,630,469 | * 5/1997 | Butterbaugh et al. | 165/80.3 |
| 5,699,229 | 12/1997 | Brownell | 361/719 |
| 5,748,446 | 5/1998 | Feightner et al. | 361/709 |
| 5,761,041 | 6/1998 | Hassanzadeh et al. | 361/704 |
| 5,828,549 | * 10/1998 | Gandre et al. | 361/695 |
| 5,828,692 | * 3/1999 | Lee et al. | 165/80.3 |
| 5,847,928 | 12/1998 | Hinshaw et al. | 361/704 |
| 5,881,800 | 3/1999 | Chung | 165/80.3 |
| 5,884,692 | 3/1999 | Lee et al. | 165/80.3 |
| 5,927,386 | * 7/1999 | Lin | 361/695 |
| 5,936,836 | * 8/1999 | Scholder | 361/695 |
| 5,946,188 | * 8/1999 | Rochel et al. | 361/690 |
| 5,959,350 | 9/1999 | Lee et al. | 257/712 |
| 5,991,151 | 11/1999 | Capriz | 361/704 |
| 6,069,792 | * 5/2000 | Nelik | 361/687 |

* cited by examiner

*Primary Examiner*—Leo P. Picard
*Assistant Examiner*—Boris L. Chervinsky
(74) *Attorney, Agent, or Firm*—Gunnison, McKay & Hodgson, L.L.P.; Serge J. Hodgson

(57) ABSTRACT

A heat sink structure includes a fan, a heat sink and a fan mounting bracket. The heat sink includes a base section having a lower surface and an upper surface. A first fin and a second fin extend from the upper surface of the base section. The fan mounting bracket includes a faceplate, a first side extending from the faceplate, and a second side extending from the faceplate. The first side and second side of the fan mounting bracket are fastened to the first fin and the second fin, respectively. The fan is mounted to the faceplate of the fan mounting bracket such that the fan is mounted horizontally to the heat sink.

26 Claims, 7 Drawing Sheets

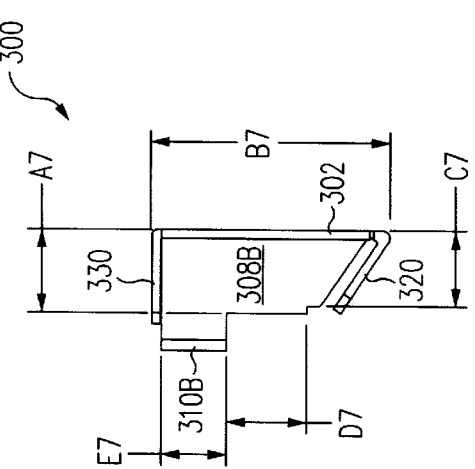
FIG. 6
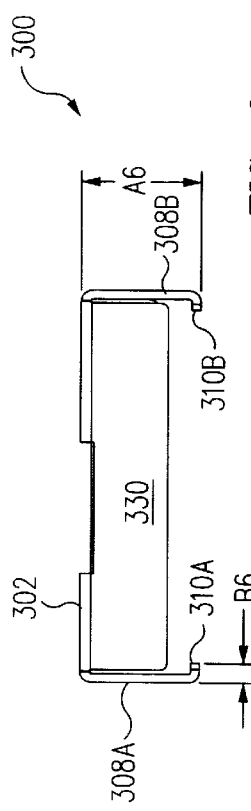
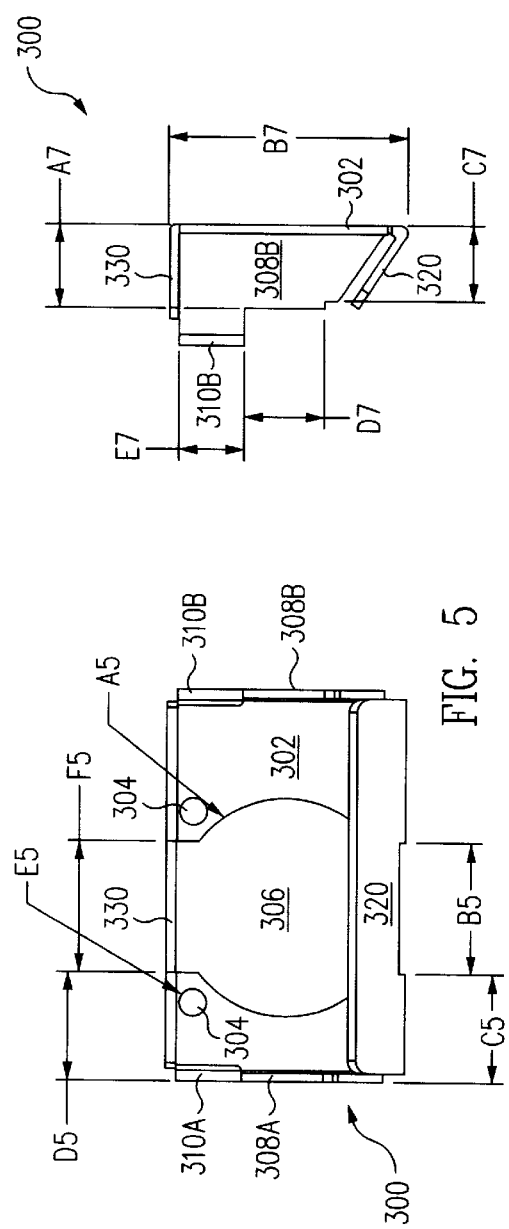
FIG. 5
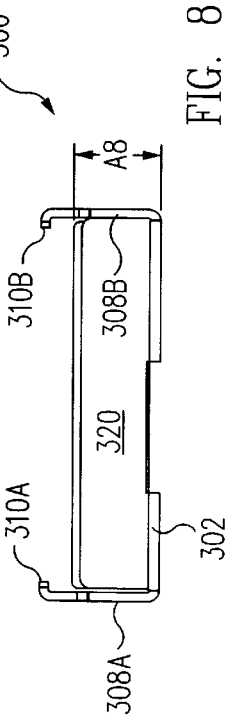
FIG. 7
FIG. 8
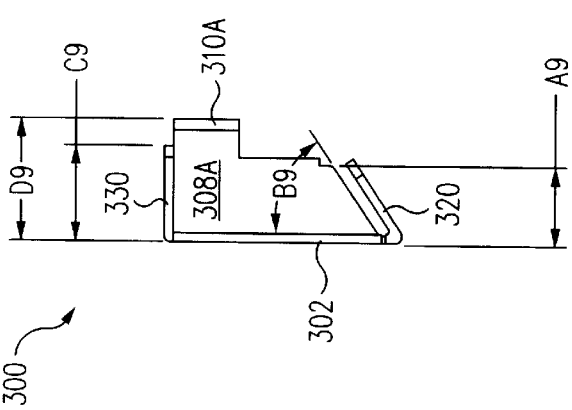
FIG. 9

FAN HEAT SINK AND METHOD

FIELD OF THE INVENTION

The present invention relates generally to cooling of electronic components in electronic devices. More particularly, the present invention relates to the removable attachment of a fan to a heat sink of an electronic device.

BACKGROUND OF THE INVENTION

As the art moves towards higher power integrated circuits and components, hereinafter referred to as heat emitting components, heat transfer from the heat emitting components becomes increasingly difficult and more important. One conventional technique used to remove heat from a heat emitting component was to employ a finned heat sink which was placed in thermal contact with the heat emitting component. In this manner, heat generated by the heat emitting component was conducted to the heat sink and then dissipated to the ambient environment.

FIG. 1 is a side plan view of a heat sink structure 10 in accordance with the prior art. Heat sink structure 10 included a finned heat sink 12 in thermal contact with a heat emitting component 14. During use, heat emitting component 14 generated heat. This heat was conducted to heat sink 12, which dissipated this heat to the ambient environment.

Heat sink 12 included a base section 16 and a plurality of fins 18 extending upwards from base section 16. To enhance heat dissipation, a fan 20 was used to draw air between fins 18. Fan 20 included a motor 22 and a propeller 24. Fan 20 was mounted to a top T of heat sink 12 such that a longitudinal axis 20L of fan 20 was perpendicular to base section 16. During use, motor 22 spun propeller 24 drawing air between fins 18 as indicated by arrows 25.

As the art moved towards smaller and lighter weight electronic devices, the spacing between fan 20 and a cabinet 26 was reduced. Generally, cabinet 26 was the housing of the electronic device, e.g., a computer system, which protected the internal components including heat sink structure 10 of the electronic device. Disadvantageously, cabinet 26 impeded airflow through fan 20, which, in turn, restricted airflow between fins 18 of heat sink 12. More particularly, when the spacing between fan 20 and cabinet 26 was small, airflow between fins 18 of heat sink 12 was severely restricted.

To further enhanced heat transfer from heat emitting component 14 and to allow mounting of heat sink 12, the area of heat sink 12 was made substantially greater than the area of heat emitting component 14. More particularly, heat emitting component 14 contacted a central region 30 of base section 16 of heat sink 12. During use, heat was conducted from heat emitting component 14 to central region 30, which was the hottest region of heat sink 12 (hereinafter hottest region 30).

Fan 20 was centrally mounted to heat sink 12 such that motor 22 was aligned with hottest region 30. Of importance, a dead spot 28 of diminished or no airflow existed directly below motor 22. Disadvantageously, hottest region 30, i.e., the hottest region of heat sink 12, was in contact with dead spot 28. As a result, there was ineffective heat transfer from hottest region 30 which significantly diminished the ability of heat sink 12 to dissipate heat from heat emitting component 14.

To prevent failure of heat emitting component 14, it was important that heat emitting component 14 remained below the maximum allowable operating temperature. When the spacing between cabinet 26 and fan 20 was small, a more powerful fan 20 was used to ensure adequate cooling of heat emitting component 14. However, using a more powerful fan 20 increased noise, which was detrimental to the performance of the electronic device, and increased power consumption, which increased the overall operating cost of the electronic device. Further, to avoid excess power consumption and to avoid exceeding noise level limits, the size of fan 20 was severely restricted.

SUMMARY OF THE INVENTION

In accordance with the present invention, a heat sink structure having a fan mounted horizontally to a heat sink is presented. By mounting the fan horizontally, the fan forces air to flow horizontally along the length of fins of the heat sink. Since the air flows horizontally, the heat sink structure is well suited for use when the spacing between a cabinet and the heat sink is relatively small.

Further, since the fan is mounted horizontally, space between the cabinet and the heat sink does not have to be allocated to accommodate a vertically mounted fan as in the prior art. Advantageously, this space, which would otherwise be allocated for the vertically mounted fan, is used for other purposes. For example, the fins of the heat sink are made larger thus increasing the surface area, and hence heat transfer efficiency, of the heat sink.

In addition, since the air flows horizontal along the entire length of the fins, the airflow directly contacts the region of the heat sink which is in direct contact with the heat emitting component. By providing airflow to the hottest region of the heat sink, i.e., the region in contact with the heat emitting component, the heat transfer efficiency of the heat sink is maximized.

Recall that in the prior art, the motor of the vertically mounted fan was directly aligned with the hottest region of the heat sink. Disadvantageously, a dead spot, i.e., a region of diminished or no airflow, existed directly below the motor, and this dead spot was in direct contact with the hottest region of the heat sink. As a result, there was ineffective heat transfer from the hottest region of the heat sink. By mounting the fan horizontally in accordance with the present invention, the dead spot of the prior art is eliminated.

In one embodiment, a heat sink structure includes a heat sink having a base section having a first surface and a fan mounted to the heat sink, a longitudinal axis of the fan being parallel to the first surface.

In another embodiment, a heat sink structure includes a heat sink and a fan mounting bracket. The heat sink includes a base section having a first surface and a second surface. A first fin and a second fin extend from the second surface of the base section.

The fan mounting bracket includes a faceplate, a first side extending from the faceplate, and a second side extending from the faceplate. The first side and the second side of the fan mounting bracket are fastened to the first fin and the second fin, respectively.

Also in accordance with the present invention, a method includes mounting a fan to a faceplate of a fan mounting bracket, the fan mounting bracket having a first side and a second side extending from the faceplate. The fan mounting bracket is mounted to a heat sink having a first fin and a second fin. The fan mounting bracket is mounted by fastening the first side of the fan mounting bracket to the first fin and the second side of the fan mounting bracket to the second fin. A first surface of a base section of the heat sink is thermally connected to a heat emitting component such that a longitudinal axis of the fan is parallel to the first surface.

These and other features and advantages of the present invention will be more readily apparent from the detailed description set forth below taken in conjunction with the accompanying drawings.

BRIEF DESCRIPTION OF THE DRAWINGS

FIG. 5 is a rear plan view of the fan mounting bracket of FIG. 3.

FIG. 6 is a top plan view of the fan mounting bracket of FIG. 3.

FIG. 7 is a side plan view of the fan mounting bracket of FIG. 3.

FIG. 8 is a bottom plan view of the fan mounting bracket of FIG. 3.

FIG. 9 is a side plan view of the fan mounting bracket of FIG. 3.

In the following description, the same or similar elements are labeled with the same or similar reference numbers.

DETAILED DESCRIPTION

Figure 1:
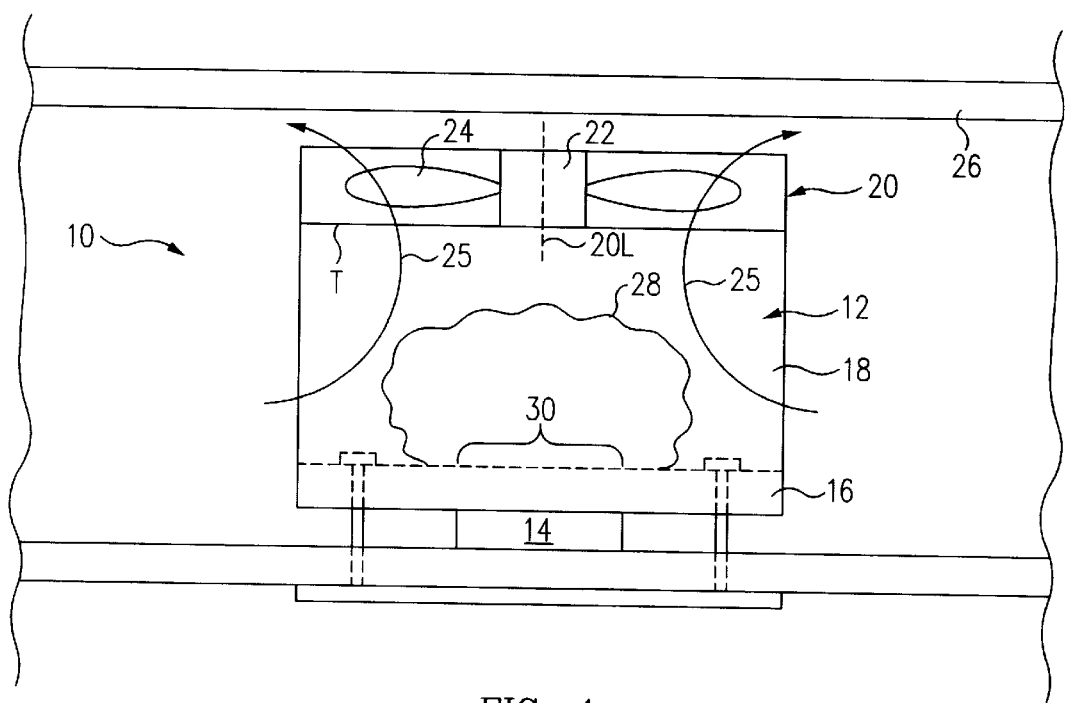
FIG. 1 is a side plan view of a heat sink structure in accordance with the prior art.

In accordance with the present invention, a heat sink structure 200 (FIG. 2) having a fan 220 mounted horizontally to a heat sink 212 is presented. By mounting fan 220 horizontally, fan 220 forces air to flow horizontally along length L of fins 218 of heat sink 212. Since the air flows horizontally, heat sink structure 200 is well suited for use when the spacing between a cabinet 226 and heat sink 212 is relatively small.

Further, since fan 220 is mounted horizontally, space between cabinet 226 and heat sink 212 does not have to be allocated to accommodate a vertically mounted fan as in the prior art. Advantageously, this space, which would otherwise be allocated for the vertically mounted fan, is used for other purposes. For example, fins 218 of heat sink 212 are made larger as shown by the dashed line 218L thus increasing the surface area, and hence heat transfer efficiency, of heat sink 212.

In addition, since the air flows horizontal along the entire length L of fins 218, the airflow directly contacts the hottest region of heat sink 212, i.e., directly contact a central region 230 of heat sink 212, which is in direct thermal contact with heat emitting component 214. By providing airflow to the hottest region of heat sink 212, i.e., to central region 230, the heat transfer efficiency of heat sink 212 is maximized.

Recall that in the prior art, the motor of the vertically mounted fan was directly aligned with the hottest region of the heat sink. Disadvantageously, a dead spot, i.e., a region of diminished or no airflow, existed directly below the motor, and this dead spot was in direct contact with the hottest region of the heat sink. As a result, there was ineffective heat transfer from the hottest region of the heat sink. By horizontally mounting fan 220 in accordance with the present invention, the dead spot of the prior art is eliminated.

Figure 2:
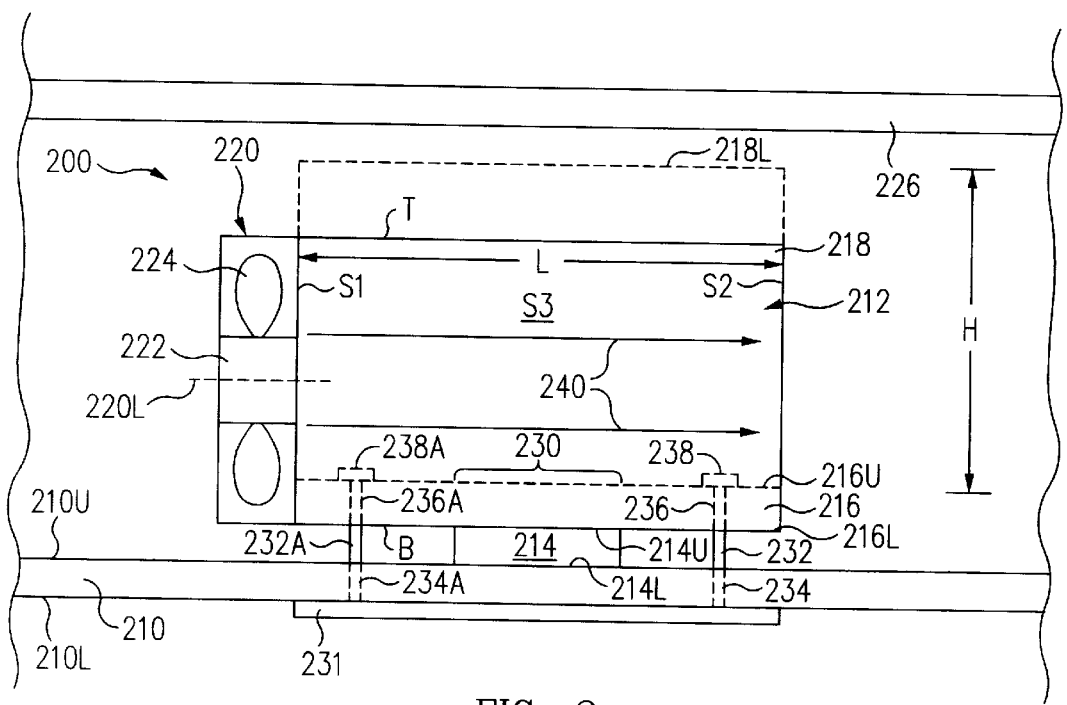
FIG. 2 is a side plan view of a heat sink structure in accordance with the present invention.

More particularly, FIG. 2 is a side plan view of a heat sink structure 200 in accordance with the present invention. Referring to FIG. 2, a lower, e.g., first, surface 214L of a heat emitting component 214 is attached to an upper, e.g., first, surface 210U of a substrate 210 such as a printed circuit board. A lower, e.g., first, surface 216L of a base section 216 of a heat sink 212 is in thermal contact, e.g., by direct physical contact, with an upper, e.g., second, surface 214U of heat emitting component 214. Heat sink 212 further includes a plurality of fins 218 on an upper, e.g., second, surface 216U of base section 216 of heat sink 212. Fins 218 extend upwards, e.g., in a first direction, from base section 216.

A bolster plate 231 is positioned opposite of heat emitting component 214 on a lower, e.g., second, surface 210L of substrate 210. Extending upwards from bolster plate 231 are a plurality of pins 232. For example, bolster plate 231 is rectangular when viewed from below and a pin 232 is located at each corner of bolster plate 231 for a total of four pins 232. Pins 232 pass through corresponding apertures 234 of substrate 210 and through corresponding apertures 236 of base section 216 of heat sink 212. Heads 238 of pins 232 press downwards, e.g., in a second direction opposite the first direction, on upper surface 216U of heat sink 212.

To illustrate, a first pin 232A of the plurality of pins 232 passes through a first aperture 234A of the plurality of apertures 234. Pin 232A further passes through a first aperture 236A of the plurality of apertures 236. A head 238A of pin 232A presses downwards on upper surface 216U of base section 216 of heat sink 212. The other pins 232 pass through corresponding apertures 234 and corresponding apertures 236 and have corresponding heads 238 which press downwards on upper surface 216U in a similar manner and so are not discussed further to avoid detracting from the principals of the invention.

Heat emitting component 214 is attached to upper surface 210U of substrate 210 in a conventional manner. For example, heat emitting component 214 is a ball grid array or a pin grid array type component. By positioning heat emitting component 214 and substrate 210 between heat sink 212 and bolster plate 231, heat sink 212 is pressed into thermal contact with heat emitting component 214.

In one embodiment, heat emitting component 214 is held in place on substrate 210 by heat sink 212. For example, heat emitting component 214 includes a land grid array type central processing unit (CPU) and a socket, which is located between the CPU and substrate 210. In one embodiment, heat emitting component 214 includes a thermal pad and/or thermal grease between the CPU and heat sink 212. Suitable CPUs, sockets, thermal pads and/or thermal greases are well known to those of skill in the art and are not illustrated in the figures or discussed further for purposes of clarity.

Although use of bolster plate 231 and pins 232 to press heat sink 212 into thermal contact with heat emitting component 214 is described above, in light of this disclosure, those of skill in the art will understand that heat sink 212 can be thermally connected to heat emitting component 214 using any one of a number of conventional techniques. For example, a retainer, which attaches to pins 232, can be used to press downwards on upper surface 216U instead of heads 238 as those of skill in the art will understand. The particular techniques used to thermally connected heat sink 212 to heat emitting component 214 is not essential to the invention.

In this embodiment, heat sink 212 is rectangular in shape. More particularly, heat sink 212 includes: (1) a bottom B, i.e., lower surface 216L of base section 216; (2) a top T opposite bottom B, i.e., the tops of fins 218; (3) first and second sides S1, S2 (hereinafter perpendicular sides S1, S2) perpendicular to length L of fins 218 and extending between bottom B and top T, i.e., the edges of fins 218 and base section 216; and (4) third and fourth sides S3, S4 (hereinafter parallel sides S3, S4) parallel to length L of fins 218 and extending between bottom B and top T, i.e., the outer surfaces of the outermost fins 218. (Parallel side S4 is not visible in the side plan view of FIG. 2.)

Perpendicular sides S1, S2 are opposite and parallel to one another and extend between parallel side S3 and parallel side S4. Similarly, parallel sides S3, S4 are opposite and parallel to one another and extend between perpendicular side S1 and perpendicular side S2.

Although a rectangular heat sink 212 is set forth, in light of this disclosure, those of skill in the art will understand that other heat sinks can be used. For example, a cylindrical tower type finned heat sink is used. As a further example, top T, bottom B, perpendicular side S1, perpendicular side S2, parallel side S3, and/or parallel side S4 are not planar but include indentations, notches, grooves or other features.

A fan 220 is mounted to perpendicular side S1 such that a longitudinal axis 220L of fan 220 is parallel to bottom B and perpendicular to perpendicular side S1. More particularly, fan 220 includes a propeller 224 having longitudinal axis 220L. During use, a motor 222 of fan 220 spins propeller 224 around longitudinal axis 220L. Illustratively, fan 220 is mounted to perpendicular side S1 using snaps, rivets, screws or bolts.

By mounting fan 220 horizontally, fan 220 forces air to flow between fins 218 of heat sink 212 and along length L of fins 218 as shown by the arrows 240. Of importance, a steady flow of air is provided to a central region 230 of base section 216, central region 230 being in direct thermal contact with heat emitting component 214 and thus being the hottest region of heat sink 212. By providing a steady flow of air to central region 230, the heat transfer efficiency of heat sink 212 is maximized.

Recall that in the prior art, a motor of the vertically mounted fan was directly aligned with the hottest region of the heat sink (see FIG. 1, for example). Disadvantageously, a dead spot, i.e., a region of diminished or no airflow, existed directly below the motor, and this dead spot was in direct contact with the hottest region of the heat sink. As a result, there was ineffective heat transfer from the hottest region of the heat sink. By mounting fan 220 horizontally in accordance with the present invention, the dead spot of the prior art is eliminated.

Further, by horizontally mounting fan 220, only a minimum space between a cabinet 226 and heat sink 212 is needed, cabinet 26 being parallel to top T and bottom B and perpendicular to sides S1, S2, S3, S4. Advantageously, this allows the surface area of fins 218 to be maximized and, more particularly, allows a height H of fins 218 to be maximized as illustrated by the dashed line 218L. As used herein, height H is the distance from base section 216 in the upwards, e.g., vertical, direction of fins 218 and length L is the distance between perpendicular side S1 and perpendicular side S2 of fins 218 in the horizontal direction, e.g., a third direction perpendicular to the first and second directions.

In the prior art, space between the cabinet and heat sink had to be allocated to accommodate the vertically mounted fan (see FIG. 1, for example).

Disadvantageously, this limited the height of the fins of the heat sink. Accordingly, the heat transfer efficiency of the prior art heat sink was limited.

Figure 3:
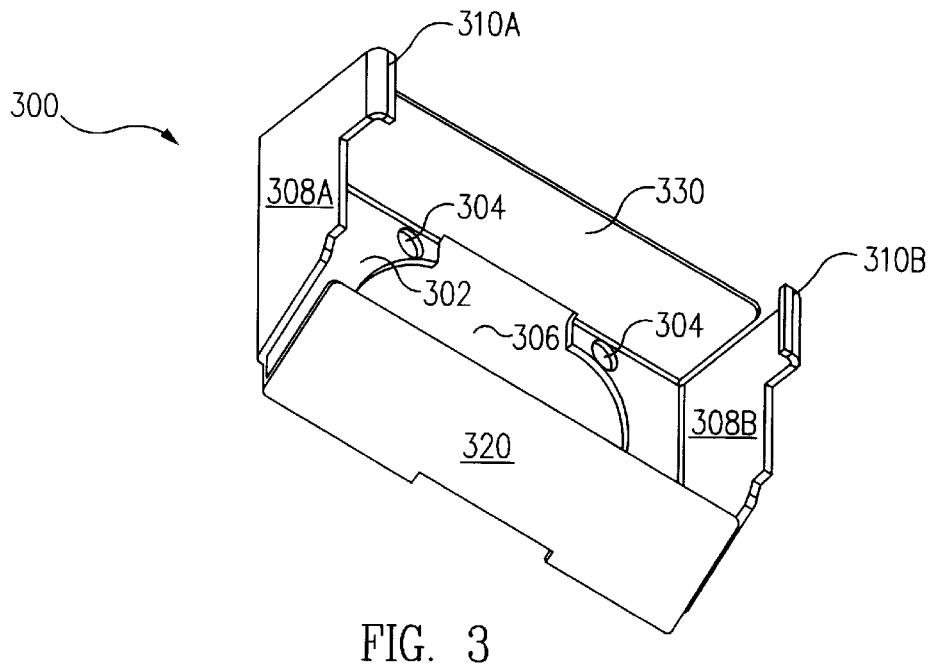
FIG. 3 is a perspective view of a fan mounting bracket in accordance with one embodiment of the present invention.

FIG. 3 is a perspective view of a fan mounting bracket 300 in accordance with one embodiment of the present invention. Referring to FIG. 3, fan mounting bracket 300 includes a faceplate 302 having a plurality of mounting holes 304, e.g., smooth or threaded holes. A fan 220A (not shown, see FIGS. 4A and 4B) is mounted to faceplate 302 by screws, bolts or rivets extending into mounting holes 304. Faceplate 302 further includes a central aperture 306 through which fan 220A blows air.

Extending from and perpendicular to faceplate 302 is a first side 308A and a second side 308B. First side 308A is opposite and parallel to second side 308B. First side 308A includes a first heat sink latching end 310A. Similarly, second side 308B includes a second heat sink latching end 310B.

Heat sink latching end 310A is a tab extending inwards from first side 308A towards second side 308B. Similarly, heat sink latching end 310B is a tab extending inwards from second side 308B towards first side 308A. As discussed in greater detail below with reference to FIGS. 4A and 4B, heat sink latching ends 310A, 310B slide into corresponding slots 402A, 402B, respectively, of a heat sink 212A thus mounting fan mounting bracket 300 including fan 220A to heat sink 212A.

Fan mounting bracket 300 further includes a wedge 320 extending from faceplate 302. As discussed in greater detail below with reference to FIGS. 4A and 4B, wedge 320 is at an angle to faceplate 302 such that wedge 320 easily slides against heat sink 212A during mounting, i.e., easily slides in the downward direction in FIG. 3, yet wedges against heat sink 212A to prevent inadvertent dismounting of fan mounting bracket 300 from heat sink 212A.

Fan mounting bracket 300 further includes a top plate 330 extending from and perpendicular to faceplate 302. As discussed in greater detail below with reference to FIGS. 4A and 4B, top plate 330 supports fan mounting bracket 300 against a top T of heat sink 212A. Further, first side 308A, second side 308B, top plate 330 and wedge 320 form an enclosure which directs air from fan 220A between fins 218 of heat sink 212A.

In this embodiment, fan mounting bracket 300 is integral, i.e., is a single piece and not a plurality of separate pieces connected together. For example, fan mounting bracket 300 is formed by stamping and bending a single piece of metal as those of skill in the art will understand. Generally, fan mounting bracket 300 is formed of a material having a high spring rate such that fan mounting bracket 300 returns to its relaxed state, i.e., original form, after being bent. For example, fan mounting bracket 300 is 1 mm thick stainless-steel.

Figure 4A:
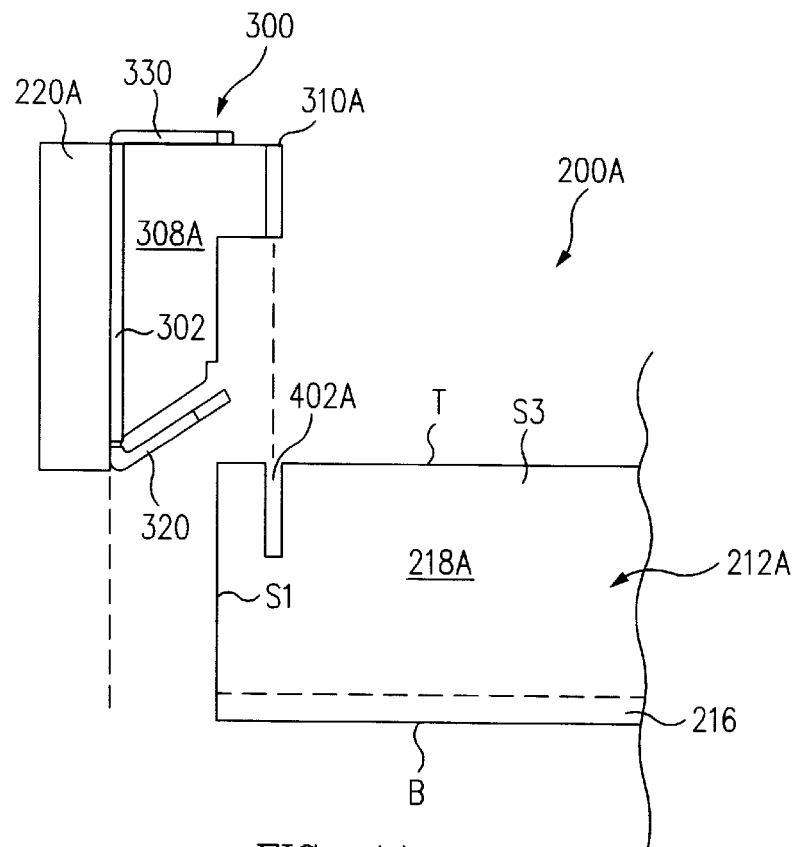
FIGS. 4A and 4B are side plan views of a heat sink structure illustrating the attachment of a fan mounting bracket to a heat sink in accordance with one embodiment of the present invention.
Figure 4B:
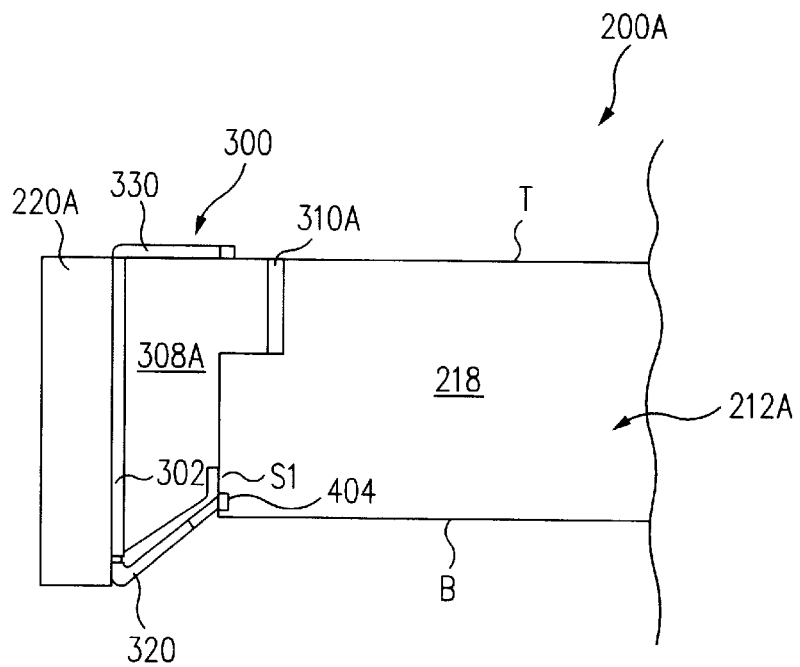

FIGS. 4A and 4B are side plan views of a heat sink structure 200A illustrating the attachment of fan mounting bracket 300 to heat sink 212A in accordance with one embodiment of the present invention. In FIGS. 4A and 4B, heat emitting component 214, pins 232, substrate 210 and bolster plate 231 are not illustrated for purposes of clarity.

Referring to FIG. 4A, at least the outermost of fins 218 (see fins 218A, 218B of FIGS. 13, 14, for example) of heat sink 212A are formed with slots 402. To illustrate, a first fin 218A of the plurality of fins 218, which is an outermost fin 218 that forms parallel side S3, has a first slot 402A of the plurality of slots 402. Slot 402A, e.g., a rectangular slot, extends downwards from top T towards bottom B of heat sink 212A. A second fin 218B of the plurality of fins 218, which is also an outermost fin 218 that forms parallel side S4 (not shown in the views of FIGS. 4A and 4B, see FIGS. 13, 14, for example) has a slot 402B similar to slot 402A.

As shown in FIG. 4A, heat sink latching end 310A is aligned with slot 402A. Fan mounting bracket 300 is moved relative to heat sink 212A, e.g., by moving fan mounting bracket 300 downwards, thus engaging heat sink latching end 310A with slot 402A. More particularly, heat sink latching end 310A is slid into slot 402A. Although alignment and sliding of heat sink latching end 310A into slot 402A is discussed above and illustrated in FIGS. 4A, 4B, it is understood that heat sink latching end 310B is simultaneously aligned and slid into slot 402B.

Referring now to FIG. 4B, as heat sink latching ends 310A, 310B are slid into slots 402A, 402B, respectively, wedge 320 is bent upwards by perpendicular side S1 towards faceplate 302. Advantageously, since wedge 320 is angled upwards towards top plate 330, wedge 320 is easily bent towards faceplate 302 and thus slides against perpendicular side S1 of heat sink 212A with little resistance in the downward direction. However, wedge 320 digs into perpendicular side S1 thus resisting sliding against perpendicular side S1 in the upwards direction. In this manner, fan mounting bracket 300 is securely locked to heat sink 212A. To further insure locking of fan mounting bracket 300 to heat sink 212A, in one embodiment, perpendicular side S1 includes a notch 404 into which wedge 320 snaps.

Fan mounting bracket 300 is also easily removed from heat sink 212A. To remove fan mounting bracket 300, wedge 320 is pressed upwards towards faceplate 302 thus releasing wedge 320 from perpendicular side S1. Fan mounting bracket 300 is moved upwards to slide heat sink latching ends 310A, 310B from slots 402A, 402B, respectively, thus dismounting fan mounting bracket 300 from heat sink 212A.

FIG. 5 is a rear plan view of fan mounting bracket 300 of FIG. 3 in accordance with one embodiment of the present invention. Illustrative specifications for the various characteristics illustrated in FIG. 5 are set forth below in Table 1. In Tables 1–13 below, all dimensions are in millimeters unless otherwise stated.

TABLE 1

| CHARACTERISTIC | SPECIFICATION |
| --- | --- |
| A5 | R14.00 |
| B5 | 16.00 |
| C5 | 13.50 |
| D5 | 13.50 |
| E5 | R1.70 |
| F5 | 16.00 |

FIG. 6 is a top plan view of fan mounting bracket 300 of FIG. 3 in accordance with this embodiment of the present invention. Illustrative specifications for the various characteristics illustrated in FIG. 6 are set forth below in Table 2.

TABLE 2

| CHARACTERISTIC | SPECIFICATION |
| --- | --- |
| A6 | 15.00 |
| B6 | 2.50 |

FIG. 7 is a side plan view of fan mounting bracket 300 of FIG. 3 in accordance with this embodiment of the present invention. Illustrative specifications for the various characteristics illustrated in FIG. 7 are set forth below in Table 3.

TABLE 3

| CHARACTERISTIC | SPECIFICATION |
| --- | --- |
| A7 | 10.30 |
| B7 | 30.87 |
| C7 | 9.00 |
| D7 | 11.50 |
| E7 | 8.80 |

FIG. 8 is a bottom plan view of fan mounting bracket 300 of FIG. 3 in accordance with this embodiment of the present invention. An illustrative specification for the various characteristics illustrated in FIG. 8 is set forth below in Table 4.

TABLE 4

| CHARACTERISTIC | SPECIFICATION |
| --- | --- |
| A8 | 11.00 |

FIG. 9 is a side plan view of fan mounting bracket 300 of FIG. 3 in accordance with this embodiment of the present invention. Illustrative specifications for the various characteristics illustrated in FIG. 9 are set forth below in Table 5.

TABLE 5

| CHARACTERISTIC | SPECIFICATION |
| --- | --- |
| A9 | 9.00 |
| B9 | 60.0° |
| C9 | 11.00 |
| D9 | 15.00 |

Figure 10:
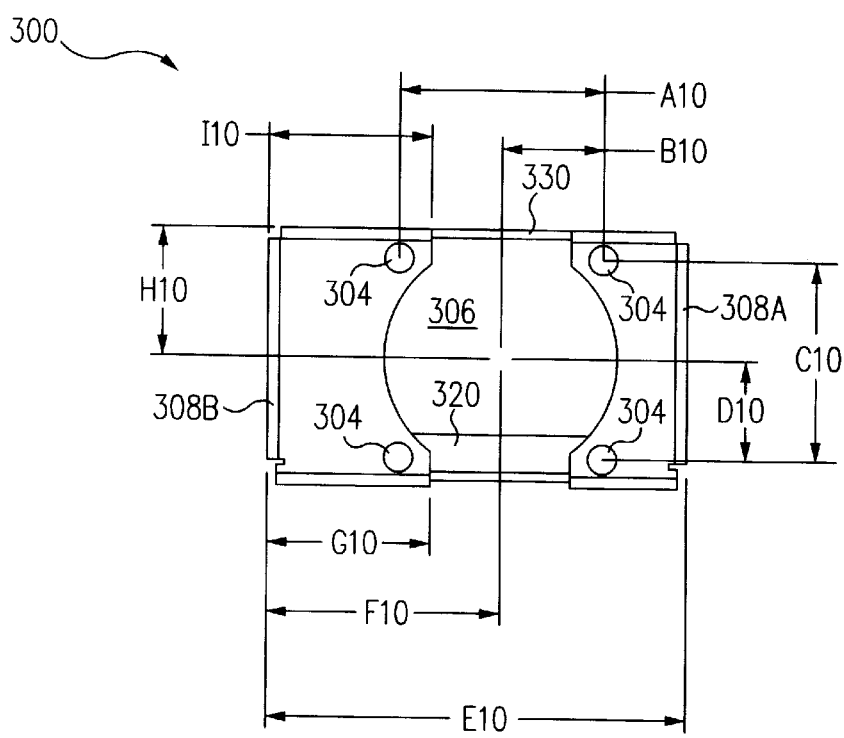
FIG. 10 is a front plan view of the fan mounting bracket of FIG. 3.

FIG. 10 is a front plan view of fan mounting bracket 300 of FIG. 3 in accordance with this embodiment of the present invention. Illustrative specifications for the various characteristics illustrated in FIG. 10 are set forth below in Table 6.

TABLE 6

| CHARACTERISTIC | SPECIFICATION |
| --- | --- |
| A10 | 24.00 |
| B10 | 12.00 |
| C10 | 24.00 |
| D10 | 12.00 |
| E10 | 49.00 |
| F10 | 27.50 |
| G10 | 19.50 |
| H10 | 15.50 |
| I10 | 19.50 |

Figure 11:
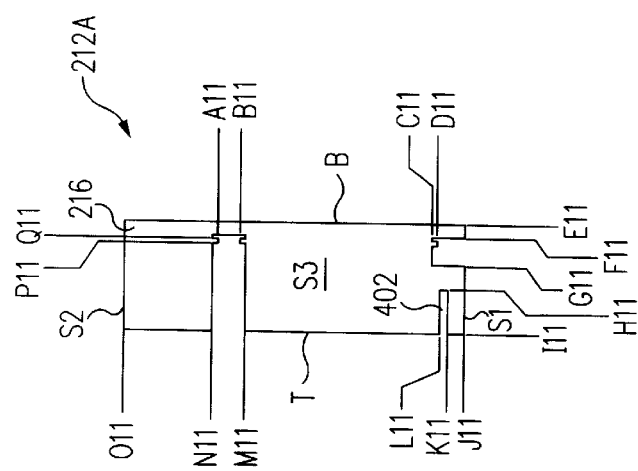
FIG. 11 is a side plan view of a heat sink in accordance with one embodiment of the present invention.

FIG. 11 is a side plan view of heat sink 212A in accordance with one embodiment of the present invention. Illustrative specifications for the various characteristics illustrated in FIG. 11 are set forth below in Table 7.

TABLE 7

| CHARACTERISTIC | SPECIFICATION |
| --- | --- |
| A11 | 54.80 |
| B11 | 48.80 |
| C11 | 7.50 |
| D11 | 6.20 |
| E11 | 0.00 |
| F11 | 3.00 |
| G11 | 9.80 |
| H11 | 15.00 |
| I11 | 25.00 |
| J11 | 0.00 |
| K11 | 3.64 |
| L11 | 5.14 |
| M11 | 47.50 |
| N11 | 56.10 |
| O11 | 75.00 |
| P11 | 4.90 |
| Q11 | 4.00 |

Figure 12:
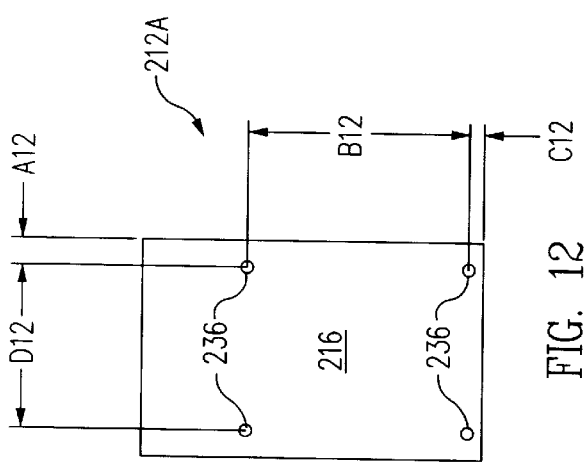
FIG. 12 is a bottom plan view of the heat sink of FIG. 11.

FIG. 12 is a bottom plan view of heat sink 212A of FIG. 11 in accordance with this embodiment of the present invention. Illustrative specifications for the various characteristics illustrated in FIG. 12 are set forth below in Table 8.

TABLE 8

| CHARACTERISTIC | SPECIFICATION |
| --- | --- |
| A12 | 5.60 |
| B12 | 48.60 |
| C12 | 3.20 |
| D12 | 34.80 |

Figure 13:
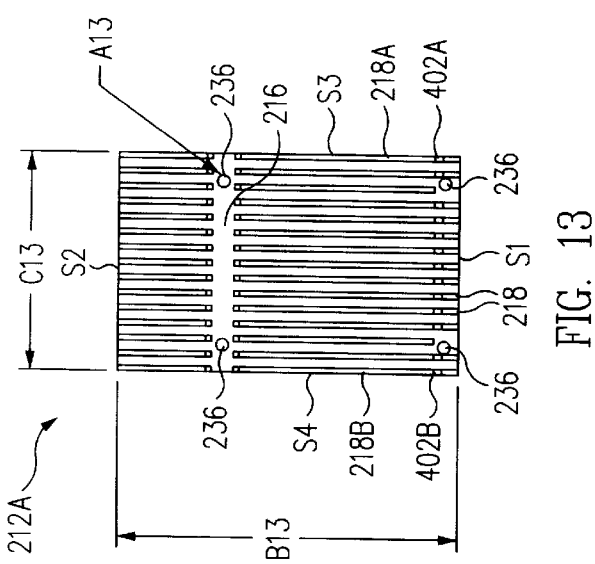
FIG. 13 is a top plan view of the heat sink of FIG. 11.

FIG. 13 is a top plan view of heat sink 212A of FIG. 11 in accordance with this embodiment of the present invention. Illustrative specifications for the various characteristics illustrated in FIG. 13 are set forth below in Table 9.

TABLE 9

| CHARACTERISTIC | SPECIFICATION |
| --- | --- |
| A13 | R1.50 4X |
| B13 | 75.00 |
| C13 | 46.00 |

Figure 14:
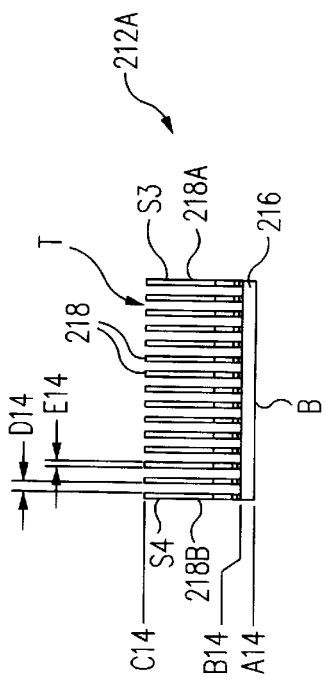
FIG. 14 is a front plan view of the heat sink of FIG. 11.

FIG. 14 is a front plan view of heat sink 212A of FIG. 11 in accordance with this embodiment of the present invention. Illustrative specifications for the various characteristics illustrated in FIG. 14 are set forth below in Table 10.

TABLE 10

| CHARACTERISTIC | SPECIFICATION |
| --- | --- |
| A14 | 0.00 |
| B14 | 3.00 |
| C14 | 25.00 |
| D14 | 2.18 14X |
| E14 | 1.03 15X |

FIGS. 3–14 set forth use of fan mounting bracket 300 for mounting of fan 220A to heat sink 212A in accordance with one embodiment of the present invention. However, in light of this disclosure, those of skill in the art will understand that fan 220A can be mounted to heat sink 212A using other techniques.

For example, fan 220A is directly mounted, e.g., with screws, bolts or pop rivets, to heat sink 212A.

Further, although use of heat sink latching ends 310A, 310B and slots 402A, 402B in combination with wedge 320 are used to mount fan mounting bracket 300 to heat sink 212A, in light of this disclosure, those of skill in the art will understand that fan mounting bracket 300 can be mounted to heat sink 212A using other techniques. For example, as discussed in greater detail below with reference to FIGS. 15–18, screws or pop rivets are used to mount a fan mounting bracket in accordance with the present invention to a heat sink.

Figure 15:
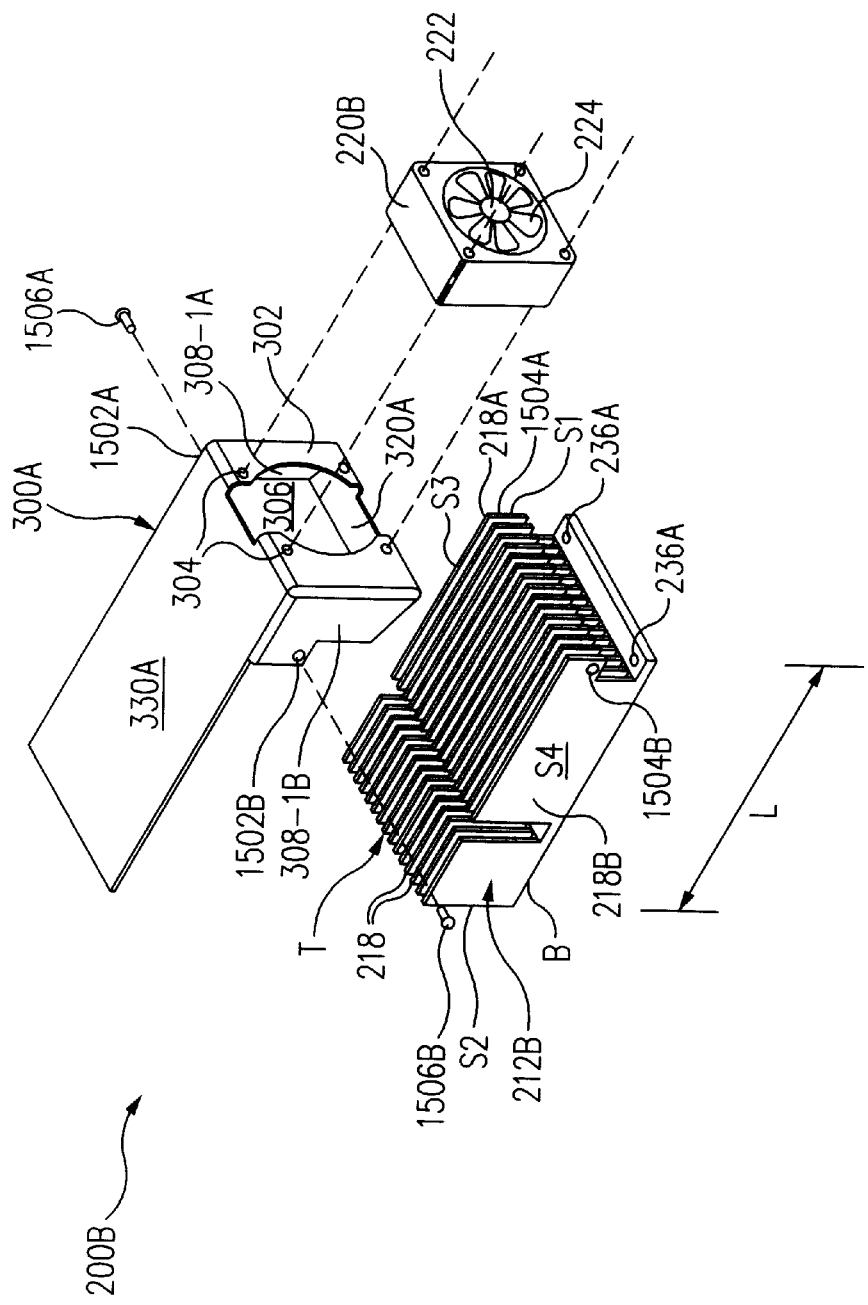
FIG. 15 is an exploded perspective view of a heat sink structure in accordance With an alternative embodiment of the present invention.

FIG. 15 is an exploded perspective view of a heat sink structure 200B in accordance with an alternative embodiment of the present invention. Heat emitting component 214, substrate 210, bolster plate 231 and pins 232 (see FIG. 2, for example) are not illustrated in FIG. 15 to avoid detracting from the principals of the invention. Further, fan mounting bracket 300A, fan 220B, and heat sink 212B of FIGS. 15–18 are substantially similar to fan mounting bracket 300, fan 220A, and heat sink 212A, respectively, of FIGS. 3–14 and only the relevant differences are discussed below.

Referring now to FIG. 15, in this embodiment, first side 308-1A of fan mounting bracket 300A has a first aperture 1502A (not visible in the view of FIG. 15) and second side 308-1B of fan mounting bracket 300A has a second aperture 1502B. Heat sink 212B has a first mounting hole 1504A (not visible in the view of FIG. 15) in first fin 218A and also has a second mounting hole 1504B in second fin 218B. First mounting hole 1504A in heat sink 212B corresponds to aperture 1502A in fan mounting bracket 300A. Similarly, second mounting hole 1504B in heat sink 212B corresponds to aperture 1502B in fan mounting bracket 300A.

To mount fan mounting bracket 300A to heat sink 212B, apertures 1502A, 1502B are aligned with mounting holes 1504A, 1504B, respectively. A fastener 1506A is passed through aperture 1502A and is fastened to mounting hole 1504A. Similarly, a fastener 1506B is passed through aperture 1502B and is fastened to mounting hole 1504B. For example, fasteners 1506A, 1506B are bolts, screws or pop rivets extending through apertures 1502A, 1502B and fastened to mounting holes 1504A, 1504B. In this manner, fasteners 1506A, 1506B mount fan mounting bracket 300A to heat sink 212B. More particularly, first side 308-1A and second side 308-1B are fastened to first fain 218A and second fin 218B by fasteners 1506A, 1506B, respectively.

Also in accordance with this embodiment, top plate 330A has a length equal with length L of fins 218. Thus, top plate 330A entirely covers top T of heat sink 212B. By entirely covering top T, top plate 330A forces air to flow between fins 218 thus enhancing the heat transfer efficiency of heat sink 212B.

Figure 16:
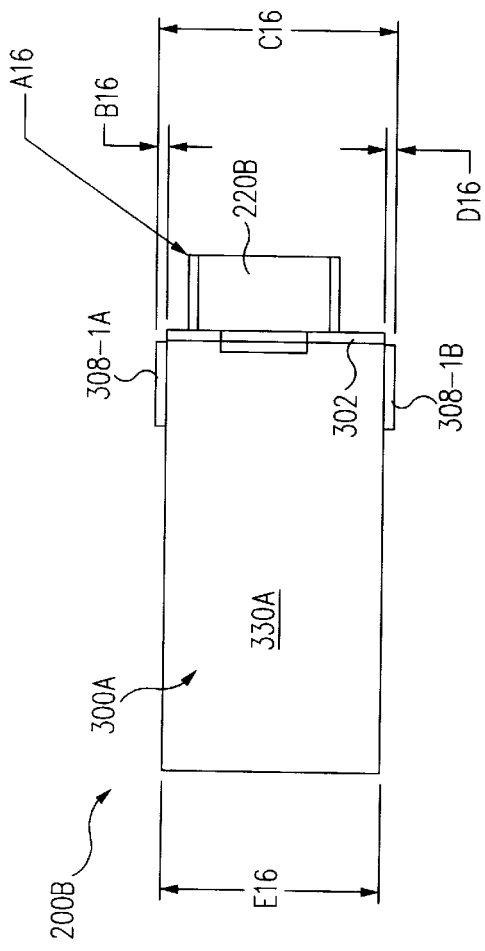
FIG. 16 is a top plan view of the heat sink structure of FIG. 15.

FIG. 16 is a top plan view of heat sink structure 200B of FIG. 15 in accordance with this embodiment of the present invention. Illustrative specifications for the various characteristics illustrated in FIG. 16 are set forth below in Table 11.

TABLE 11

| CHARACTERISTIC | SPECIFICATION |
| --- | --- |
| A16 | 30 × 30 × 15 |
| B16 | 1.40 |
| C16 | 48.79 |
| D16 | 1.40 |
| E16 | 46.00 |

Figure 17:
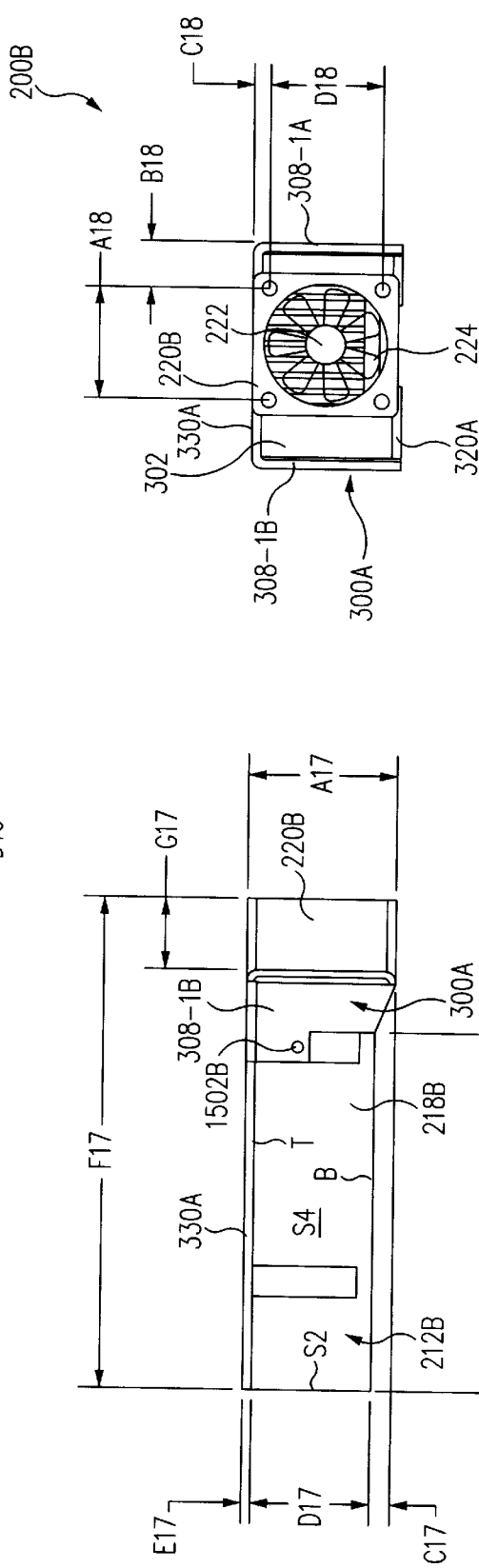
FIG. 17 is a side plan view of the heat sink structure of FIG. 15.

FIG. 17 is a side plan view of heat sink structure 200B of FIG. 15 in accordance with this embodiment of the present invention. Illustrative specifications for the various characteristics illustrated in FIG. 17 are set forth below in Table 12.

TABLE 12

| CHARACTERISTIC | SPECIFICATION |
| --- | --- |
| A17 | 30.72 |
| B17 | 75.01 |
| C17 | 4.75 |
| D17 | 24.99 |
| E17 | 1.02 |
| F17 | 100.00 |
| G17 | 15.00 |

Figure 18:
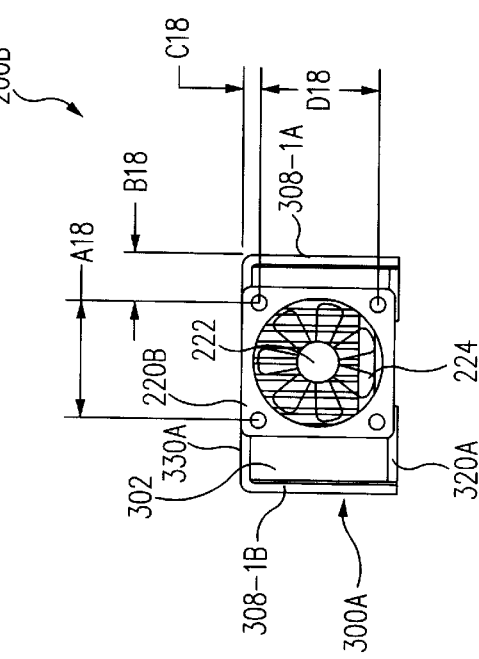
FIG. 18 is a front plan view of the heat sink structure of FIG. 15.

FIG. 18 is a front plan view of heat sink structure 200B of FIG. 15 in accordance with this embodiment of the present invention. Illustrative specifications for the various characteristics illustrated in FIG. 18 are set forth below in Table 13.

TABLE 13

| CHARACTERISTIC | SPECIFICATION |
| --- | --- |
| A18 | 24.00 |
| B18 | 9.20 |
| C18 | 3.02 |
| D18 | 24.00 |

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

I claim:

1. A heat sink structure comprising:
    a heat sink having a base section having a first surface;
    a fan mounting bracket comprising:
        a faceplate comprising mounting holes;
        a first side extending from said faceplate; and
        a second side extending from said faceplate,
        wherein said first side and said second side are fastened to said heat sink; and
    a fan mounted to said faceplate by fasteners extending into said mounting holes, a longitudinal axis of said fan being parallel to said first surface.

2. The heat sink structure of claim 1 further comprising a heat emitting component in thermal contact with said first surface of said base section.

3. The heat sink structure of claim 2 wherein said heat sink further comprises fins on a second surface of said base section.

4. The heat sink structure of claim 3 wherein said first surface is a bottom of said heat sink, said heat sink further comprising a top opposite said bottom and a first side extending between said bottom and said top, said fan being mounted to said first side by said fan mounting bracket.

5. The heat sink structure of claim 4 wherein said longitudinal axis of said fan is perpendicular to said first side.

6. The heat sink structure of claim 5 wherein said fan comprises a motor and a propeller, said motor spinning said propeller around said longitudinal axis.

7. The heat sink structure of claim 1 further comprising a cabinet parallel to said first surface.

8. The heat sink structure of claim 1 wherein said heat sink is rectangular, said first surface being a bottom of said heat sink, said heat sink further comprising a top opposite said bottom and a first side extending between said bottom and said top, said fan being mounted to said first side by said fan mounting bracket.

9. The heat sink structure of claim 8 further comprising a heat emitting component in thermal contact with said bottom.

10. The heat sink structure of claim 8 wherein said heat sink further comprises fins extending from a second surface of said base section, said first side being edges of said fins.

11. A heat sink structure comprising:
    a heat sink comprising:
        a base section having a first surface and a second surface;
        a first fin extending from said second surface of said base section; and
        a second fin extending from said second surface of said base section;
    a fan mounting bracket comprising:
        a faceplate;
        a first side extending from said faceplate; and
        a second side extending from said faceplate,
    wherein said first side is fastened to said first fin and said second side is fastened to said second fin.

12. The heat sink structure of claim 11 further comprising a fan mounted to said faceplate.

13. The heat sink structure of claim 12 wherein a longitudinal axis of said fan is parallel to said first surface.

14. The heat sink structure of claim 11 wherein said first fin comprises a first slot, said second fin comprises a second slot, said first side comprising a first heat sink latching end engaged with said first slot, said second side comprising a second heat sink latching end engaged with said second slot.

15. The heat sink structure of claim 14 wherein said first heat sink latching end is a tab extending from said first side towards said second side.

16. The heat sink structure of claim 14 wherein said fan mounting bracket further comprises a wedge extending from said faceplate at an angle.

17. The heat sink structure of claim 11 wherein said first fin comprises a first mounting hole, said second fin comprises a second mounting hole, said first side comprising a first aperture aligned with said first mounting hole, said second side comprising a second aperture aligned with said second mounting hole, said heat sink structure further comprising:
    a first fastener extending through said first aperture and fastened to said first mounting hole; and
    a second fastener extending through said second aperture and fastened to said second mounting hole.

18. The heat sink structure of claim 17 wherein said first fastener is a pop rivet and said second fastener is a pop rivet.

19. The heat sink structure of claim 11 further comprising a top plate extending from said faceplate.

20. The heat sink structure of claim 11 wherein said fan mounting bracket is integral.

21. A method comprising:

mounting a fan to a faceplate of a fan mounting bracket, said fan mounting bracket comprising a first side extending from said faceplate and a second side extending from said faceplate;

mounting said fan mounting bracket to a heat sink having a first fin and a second fin by fastening said first side to said first fin and said second side to said second fin; and thermally connecting a first surface of a base section of said heat sink to a heat emitting component, a longitudinal axis of said fan being parallel to said first surface.

22. The method of claim 21 wherein said mounting comprises:

aligning a first aperture of said first side with a first mounting hole in said first fin;

passing a first fastener through said first aperture; and fastening said first fastener to said first mounting hole.

23. The method of claim 21 wherein said mounting comprises:

aligning a heat sink latching end of said first side with a slot in said first fin; and sliding said heat sink latching end into said slot.

24. The method of claim 23 wherein said first surface of said base section is a bottom of said heat sink, said heat sink further comprising a top opposite said bottom and a first side extending between said top and said bottom, said method further comprising bending a wedge of said fan mounting bracket towards said faceplate with said first side.

25. The heat sink structure of claim 12 wherein said faceplate comprises mounting holes, said fan being mounted to said faceplate by fasteners extending into said mounting holes.

26. The method of claim 21 wherein said fan is mounted to said faceplate by fasteners extending into mounting holes of said faceplate.

* * * * *